US011437562B2

United States Patent
Cobanoglu et al.

(10) Patent No.: US 11,437,562 B2
(45) Date of Patent: Sep. 6, 2022

(54) COMPOSITE YARN STRUCTURE

(71) Applicant: Sanko Tekstil Isletmeleri San. Ve Tic. A.S., Inegol-Bursa (AR)

(72) Inventors: Özgür Cobanoglu, Inegol-Bursa (AR); Deniz Iyidogan, Inegol-Bursa (AR); Özgür Akdemir, Inegol-Bursa (AR)

(73) Assignee: Sanko Tekstil Isletmeleri San. Ve Tic. A.S., Inegol-Bursa (TR)

( * ) Notice: Subject to any disclaimer, the term of this patent is extended or adjusted under 35 U.S.C. 154(b) by 0 days.

(21) Appl. No.: 15/575,017

(22) PCT Filed: May 19, 2016

(86) PCT No.: PCT/EP2016/061264
§ 371 (c)(1),
(2) Date: Nov. 17, 2017

(87) PCT Pub. No.: WO2016/188853
PCT Pub. Date: Dec. 1, 2016

(65) Prior Publication Data
US 2018/0151795 A1    May 31, 2018

(30) Foreign Application Priority Data

May 22, 2015  (EP) .................................... 15169045

(51) Int. Cl.
*D02G 3/44*        (2006.01)
*D02G 3/32*        (2006.01)
(Continued)

(52) U.S. Cl.
CPC .............. *H01L 41/087* (2013.01); *D02G 3/32* (2013.01); *D02G 3/38* (2013.01); *D02G 3/441* (2013.01);
(Continued)

(58) Field of Classification Search
None
See application file for complete search history.

(56) References Cited

U.S. PATENT DOCUMENTS

| 4,568,851 A | 2/1986 | Soni et al. |
| 5,334,903 A | 8/1994 | Smith |
| (Continued) | | |

FOREIGN PATENT DOCUMENTS

| CN | 104233579 A | * 12/2014 |
| EP | 0187829 | 7/1986 |
| (Continued) | | |

OTHER PUBLICATIONS

Espacenet translation of CN-104233579-A, accessed on May 1, 2020. (Year: 2014).*

(Continued)

*Primary Examiner* — Jeremy R Pierce
*Assistant Examiner* — Christine X Nisula
(74) *Attorney, Agent, or Firm* — Silvia Salvadori

(57) ABSTRACT

It is disclosed a composite yarn structure (10) comprising: —a first element (15) comprising a coaxial flexible bi-component monofilament including a conductive component (20) and a thermoplastic component (30) exhibiting piezoelectric properties, —at least a second element (40) twisted around the first element (15), wherein the second element (40) has a lower elasticity with respect to the elasticity of the first element (15) such that, upon elongation of the yarn structure (10) in a first direction, the yarn structure (10) expands in a second direction, whereby the dimensions of the yarn are increased both in first and second directions to generate an additional force on said piezoelectric component of the first element.

16 Claims, 3 Drawing Sheets

(51) Int. Cl.
  *D02G 3/38* (2006.01)
  *H01L 41/087* (2006.01)
  *H01L 41/047* (2006.01)
  *H01L 41/08* (2006.01)
  *H01L 41/193* (2006.01)
(52) U.S. Cl.
  CPC ........ *H01L 41/0478* (2013.01); *H01L 41/082* (2013.01); *H01L 41/193* (2013.01); *D10B 2401/16* (2013.01)

(56) References Cited

U.S. PATENT DOCUMENTS

| | | | |
|---|---|---|---|
| 6,271,621 | B1 | 8/2001 | Ito et al. |
| 2004/0057176 | A1* | 3/2004 | Dhawan .................. D02G 3/38 361/62 |
| 2008/0099960 | A1* | 5/2008 | Okuzaki ................. F03G 7/005 264/405 |
| 2009/0239049 | A1* | 9/2009 | Hook ...................... D02G 3/38 428/212 |
| 2015/0280102 | A1* | 10/2015 | Tajitsu ..................... G01L 1/16 310/338 |
| 2017/0331027 | A1* | 11/2017 | Kim ..................... H01L 41/087 |

FOREIGN PATENT DOCUMENTS

| | | |
|---|---|---|
| EP | 2908357 | 8/2015 |
| GB | 2516987 | 2/2015 |
| WO | 2014058077 | 4/2014 |
| WO | 2014161920 | 10/2014 |

OTHER PUBLICATIONS

Carbon Black Nanoparticles: Knowledge Base Nanomaterials. www.nanopartikel.info/en/nanoinfo/materials/carbon-black/material-information. (Year: 2020).*

"Mechanical Behavior of Polymers." MATSE 81, PennState College of Earth and Mineral Sciences, www.e-education.psu.edu/matse81/node/2109. (Year: 2020).*

Thermoplastics and Thermoplastic Composites (3rd Edition), Table 4.72. Polyvinylidene Fluoride, PVDF: Examples of Properties. Retrieved from https://app.knovel.com/hotlink/itble/rcid:kpTTCE001D/id:kt00XRGVU1/thermoplastics-thermoplastic/table-4-72-polyvinylidene (Year: 2018).*

Engineers' Data Book (4th Edition), Table 12.5. Stainless Steels—Basic Data. Retrieved from https://app.knovel.com/hotlink/itble/rcid:kpEDBE0006/id:kt011JFRE1/engineers-data-book-4th/table-12-5-stainless (Year: 2012).*

Yuan, Q., Bateman, S. A., Wu, D. (2009). Mechanical and conductive properties of Carbon Black-filled High-Density Polyethylene, Low-density Polyethylene, and Linear Low-density polyethylene. Journal of Thermoplastic Composite Materials, 23(4), 459-471. doi:10.1177/0892705709349318 (Year: 2010).*

European Search report dated Sep. 15, 2015 for European priority applicaton No. 15169045.0.

International Search Report and written opinion dated Jul. 1, 2016 for PCT/EP/2016/061264.

IPRP issued on Nov. 28, 2017 for PCT/EP2016/061264.

Intention to grant dated Dec. 13, 2012 for priority European application No. 15169045.0.

Office Action dated Sep. 20, 2019 by the CN Patent Office for corresponding CN application No. CNP/2017178025.

Huang ate al. "A wearable yarn-based piezo-resistive sensor", Sensors and Actuators A 141 (2008) 396-403, Sience Direct, Nov. 1, 2007.

Office Action dated Mar. 24, 2020 by the JP Patent Office for corresponding JP application No. 2017-560661.

* cited by examiner

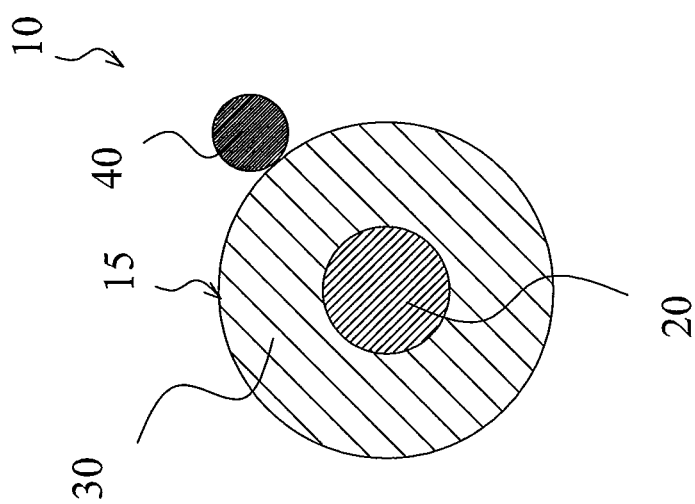
FIG. 2
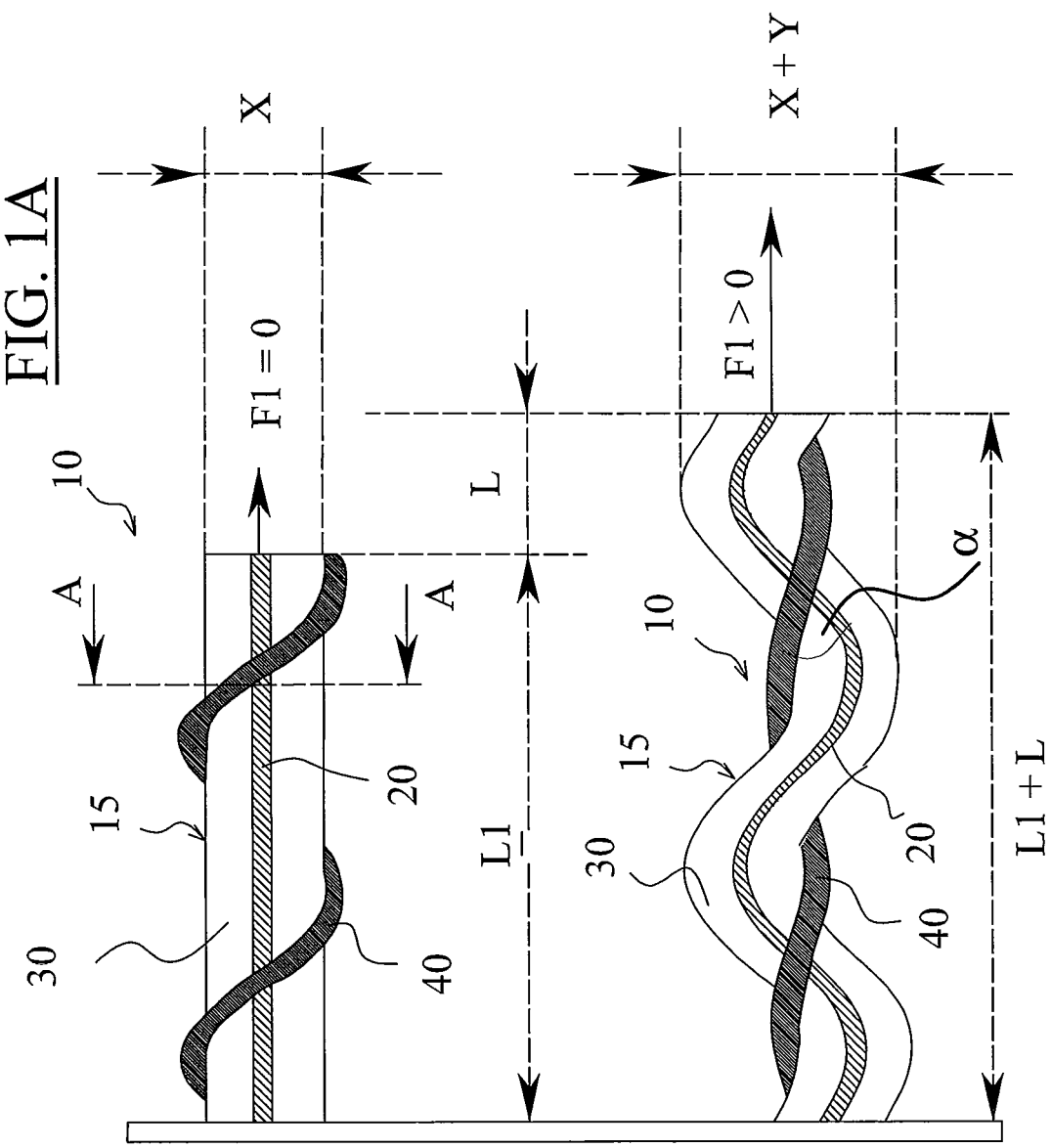
FIG. 1A
FIG. 1B

COMPOSITE YARN STRUCTURE

RELATED APPLICATIONS

This application is the US national phase application of international application number PCT/EP2016/061264 filed 19 May 2016, which designates the US and claims priority to European application EP 15169045.0 filed 22 May 2015, the contents of each of which are hereby incorporated by reference as if set forth in their entireties.

The present invention relates to a composite yarn structure, in particular to a piezoelectric yarn structure in the fields of textile construction engineering and of flexible devices physics.

Piezoelectricity is the electric charge that is generated in certain materials in response to an applied mechanical stress. In general, piezoelectric materials develop electrical potential across defined layers of the material upon pressure, strain or pulses or a combination thereof.

The piezoelectric effect is reversible, i.e. the materials in which an electrical charge is generated from an applied mechanical stress also exhibit the internal generation of a mechanical strain resulting from an applied electrical field. Piezoelectric phenomena are known and have been studied for more than a century.

Piezoelectric devices are used in many technical fields, for example in valves and for energy harvesting and for sensing applications. In particular, energy harvesting in textiles has been actively investigated; to this purpose piezoelectric yarns have been provided.

WO 2014/161920 discloses a method for producing a piezoelectric and pyroelectric fiber, wherein the fiber has a core material comprising an electrically conductive flexible thermoplastic composite comprising at least one polymer and at least one conductive filler. The fiber further comprises a surrounding material made of a permanently polarizable polymer.

Therefore such document discloses a yarn having a conductive center surrounded by a polymer in which said yarn achieves piezoelectric features.

The piezoelectric yarn may be further twisted together with a conductive yarn.

Document EP 0187829 B1 discloses a cable structure which allows a sensible piezoelectric response in a piezoelectric coaxial cable. To this end, the coaxial cable has a conductive polymer core comprising a polymeric material in which conductive particles are provided, a piezoelectric polymer layer surrounding the conductive polymer core, and an outer conductor surrounding the piezoelectric polymer layer. The cable is also provided with an outer protective jacket.

GB 2516987 discloses a fabric having a three-dimensional spacer structure, comprising a piezoelectric material acting as a spacer between knitted or woven fabric layers, for harvesting energy via the conversion of mechanical energy into electrical energy. The fabric layers comprise conductive fibres, while the interconnecting piezoelectric spacer yarns comprise piezoelectric fibres, which can be monofilaments and/or multifilaments. Alternatively, the first and second layers may comprise film-like or solid fabric materials.

A common problem of the known piezoelectric fabrics is that the intensity of the piezoelectric effect is limited. In order to enhance energy harvesting, several studies are being carried out on fabric structures that could improve the amount of generated energy.

It is an aim of the present invention to increase energy production in a fabric comprising piezoelectric yarns.

A further aim of the invention is to provide a piezoelectric yarn with increased piezoelectric effect.

These and other aims are achieved by a yarn structure having the features recited in claim 1.

In a general way, the invention relates to a composite yarn structure having a first element comprising a coaxial flexible bi-component monofilament including a conductive component and a thermoplastic component exhibiting piezoelectric properties; at least a second conductive element arranged around at least part of the first element to provide a piezoelectric yarn, characterized in that said piezoelectric yarn has auxetic properties.

Preferred embodiments are the object of dependent claims.

In greater detail, the invention relates to a composite yarn structure having:

a first element comprising a coaxial flexible bi-component monofilament including a conductive component and a thermoplastic component exhibiting piezoelectric properties, a least a second element twisted around the first element, wherein the second element has a lower elasticity with respect to the elasticity of the first element such that, upon elongation of the yarn structure in a first direction, the yarn structure expands in a second direction, whereby the dimensions of the yarn are increased both in first and second directions to generate an additional force on said piezoelectric component of the first element.

The second element is a conductive element or comprises a conductive element to provide the required piezoelectric effect. The second element may be inelastic, i.e. it may have a limited stretch (elongation) capability, lower than the stretch (elongation) properties of the first element; in other words, the second element does not elongate or elongates very little.

The behavior of the yarn is comparable to or is the same as the behavior of an auxetic yarn; the constraint against elongation provided by the second element having a low elasticity, or in other words, high rigidity obliges the first filament element to expand transversally to the direction of the elongation, bending and twisting around the stretched second element. In other words, in an unstretched condition of the composite yarn of the present invention the first element shape has a substantially rectilinear shape; the second element is twisted around the first rectilinear element in a helix.

Upon stretching, the second element is brought into a substantially or almost rectilinear shape, along the direction of stretching—elongation; once the second element has been pulled into a substantially rectilinear condition, it cannot be further stretched because of his inelastic properties, i.e. because the second element cannot be elongated in the same way as the first element. This change of status of the second, non-elastic element of the yarn of the present invention obliges the elastic first element to change from its initial rectilinear shape into a helix/sinusoidal condition in which the first element is twisted around the second element. The result is an increase in the overall dimensions of the yarn, namely of the width of the overall yarn; the composite yarn can thus be said to have auxetic properties.

The invention provides a new class of yarn structures which can create, by means of a combination of an auxetic and a piezoelectric effect, an enhanced electric potential difference between two conductors.

Another object of the invention is an article that exploits such combination of auxetic and a piezoelectric effects to increase electric potential difference created in the article. Exemplary articles are fabrics, garments, clothes and ropes.

Another object of the invention is to provide a textile yarn and a fabric including such textile yarns that may be employed in application such as textile sensors.

Auxetic materials are known since the late 1980's. Auxetic materials are materials that get thicker and/or wider along a first direction, upon stretching along a second direction perpendicular to the first direction, contrariwise to many ordinary materials. The opposite behavior is also known, namely narrowing upon pressure, instead of getting wider as expected from ordinary materials.

Auxetic fabrics have been employed in a limited number of specific uses, such as sensors, filters and smart bandages. As mentioned, an effect of the invention is that when the yarn structure is subjected to a force acting in an axial direction, the whole structure also expands in a transversal direction, giving rise to an auxetic effect.

Since the yarn structure is piezoelectric, the combination of the properties of auxeticity and of piezoelectricity in a single yarn, increase the produced pressure onto the piezoelectric material by effect of the expansion of the yarn, hence the generated electric potential difference is increased.

According to an exemplary embodiment of the invention, upon elongation of the yarn structure in a first direction, the second element is stretched to an almost rectilinear position and deforms the first element in such a way as to shape the first element in a helix fashion in the second direction, around the first element.

An effect of this embodiment is that when the yarn structure is used in a fabric, the auxetic effect increases the width of all the piezoelectric yarns present in the fabric, a phenomenon which produces additional pressure through all of the piezoelectric components, leading to an additional potential development between respective conductors.

Another aspect of the invention provides a textile fabric comprising a plurality of composite yarn structures, wherein said composite yarn structures comprise:
a first element comprising a coaxial flexible bi-component monofilament including a conductive component and a thermoplastic component exhibiting piezoelectric properties,
a second element twisted around the first element, wherein the second element is a conductive element or comprises a conductive element and has a lower elasticity with respect to the elasticity of the first element such that, upon elongation of the yarn structure in a first direction, the yarn structure expands in a second direction, whereby the dimensions of the yarn are increased both in first and second directions to generate an additional force on said piezoelectric component of the first element.

The direction in which the first element expands is angled to and may be substantially perpendicular to the first direction, according to an exemplary embodiment.

The invention will now be described in greater detail, by way of example, with reference to the accompanying, exemplary and non limiting, drawings, wherein like numerals denote like elements, and in which:

FIGS. 1A and 1B show a composite yarn structure according to a first embodiment of the invention in a first (1A) configuration and in a second configuration (1B);

FIG. 2 is a section along plane A-A of the structure of FIG. 1A.

FIG. 1A shows an embodiment of the composite yarn structure 10, according to the invention, in two different configurations.

Figure 3:
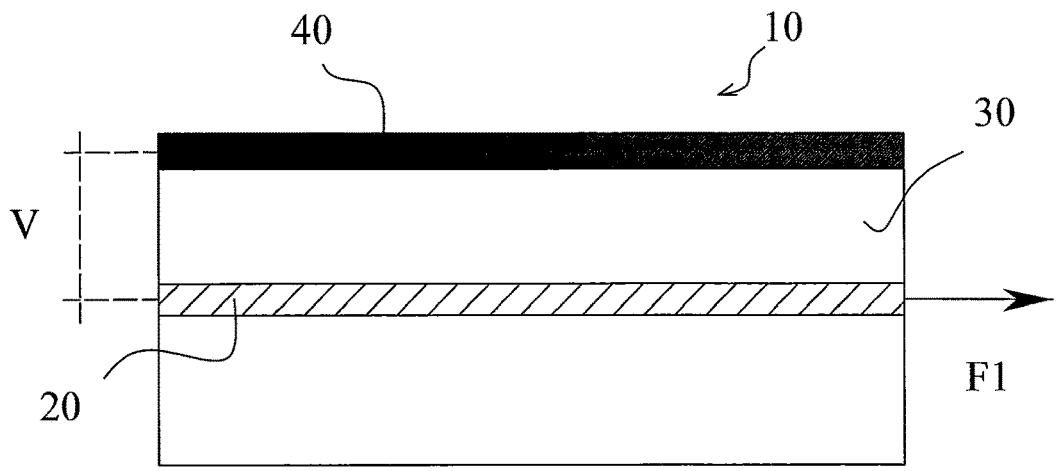
FIG. 3 is a sectional view of a yarn structure that exhibits only piezoelectricity.

The composite yarn structure 10 comprises a first element 15 comprising a coaxial flexible bi-component monofilament including a conductive component 20 and a thermoplastic component 30 exhibiting piezoelectric properties. As visible in FIGS. 1-2, in an embodiment of the invention, the thermoplastic component 30 surrounds the conductive component 10.

Suitable materials for the conductive component 20 are blends of low-density polyethylene (LDPE) or High-density polyethylene (HDPE) with carbon nanotubes (CNTs), graphite, graphene nano-sheets, carbon black (amorphous carbon), polyaniline (doped), polypyrrole (doped).

Suitable materials for the thermoplastic component 30 are polyvinylidene fluoride (PVDF) homopolymer and its copolymers with trifluoroethylene P(VDF-co-TrFE) or tetrafluoroethylene P(VDF-co-TFE), odd numbered polyamides (PA) such as PA5, PA7, PA11 and so on.

As previously mentioned, components 20 and 30, forming the first element 15, have elastic properties and can be elongated.

The composite yarn structure 10 further comprises a second element 40 twisted around the first element 15. The second element 40 has a tensile strength greater than a tensile strength of the first element 15. Moreover, the second element 40 has a lower elasticity with respect to the elasticity of the first element 15 or, in other words, a higher rigidity with respect to the rigidity of the first element 15.

FIG. 1A shows the disposition of the composite yarn of the invention in an unstretched condition; in this condition, first element 15 extends in a substantially rectilinear direction and second element 40 is twisted around first element 30 to provide a plurality of turns. The difference in elasticity between first and second elements is such that, upon stretching and elongation of the yarn's structure 10 in a first direction (see FIG. 1B), i.e. in the direction of the axis of first element, the initial shape of structure 10 is deformed by the movement of second element 40; namely the yarn's structure expands in a second direction that is angled or substantially perpendicular to the first direction, i.e. to direction of elongation of the yarn, that is corresponding to the direction of arrow F in FIGS. 1 and 2.

This phenomenon results in generation of an additional force on said piezoelectric component 30 of the first element 15.

Upon elongation of the yarn structure 10, the second element 40 is substantially aligned with the elongation direction and the first element 15 expands by forming a series of curves around the second element 40. Such curves are angled with respect to the elongation direction by an angle α comprised between 30° and 90°, preferably 30° to 80°, as shown in FIG. 1B

As the skilled person knows, a possible way to measure elasticity is to use the Young's modulus, also known as the tensile modulus or elastic modulus, namely a measure of the stiffness of an elastic material defined as the ratio of the stress (force per unit area) along an axis to the strain (ratio of deformation over initial length) along that axis in the range of stress in which Hooke's law holds. Hooke's law, as known in the art, states that the force needed to extend or compress a material by some distance is proportional to that distance.

In general, in a preferred embodiment the tensile strength of the first element is in the range of 15-78 MPa. The tensile strength of the second element is preferably in the range of 0.5-2.0 GPa. The difference in tensile strength of second to first element is of at least 422 MPa. Tensile strength is measured according to ASTM D638. Other methods of measuring tensile strength may be used.

Suitable materials for the second element are silver/copper coated polyester/polyamide yarns or fully metal filament yarns e.g. made of steel. According to an exemplary embodiment of the invention, the second element 40 may be made of at least one metallic filament.

Therefore, the composite yarn structure 10 disclosed can be used as a flexible piezoelectric yarn sensor which also exhibit auxetic features, in order to maximize its performance when used within a fabric construction or in another article made of yarns.

More in detail, as seen in FIG. 1, when the composite yarn structure 10 is subjected to a force F greater than zero in a longitudinal direction, e.g. along the axis, of the composite yarn, a shape transformation of the composite yarn structure 10 occurs. Namely the structure 10 is elongated by a length L but, at the same time, the structure 10 expands transversally in a perpendicular or angled direction with respect to the direction of the force F. As visible in the figures, the yarn increases its overall width after being stretched by force F, starting from an initial width of X and reaching a larger width of X+Y.

In other words, in the composite yarn structure 10, upon elongation of the yarn structure 10 in a first direction, the second element 40 elongates and, at the same time, stretches the first element 15 in such a way as to shape the first element 15 in an almost sinusoidal fashion in the second direction. In other words, the yarn expands transversally.

Therefore the application of force F to the composite yarn structure 10 leads to an enhanced electric potential development between the conductive component 20 of the first element 15 and the second element 40. Such electric potential can be harvested by an external circuitry (not represented for simplicity), e.g. in application such as sensors.

Considering a fabric structure comprising a plurality of composite yarn structures 10 as described above, a piezo-auxetic synergistic effect in the whole fabric may also be realized if at least two composite yarns of the invention are adjacent to each other, i.e. they are close enough to be mutually biased by the expansion step.

Figure 5:
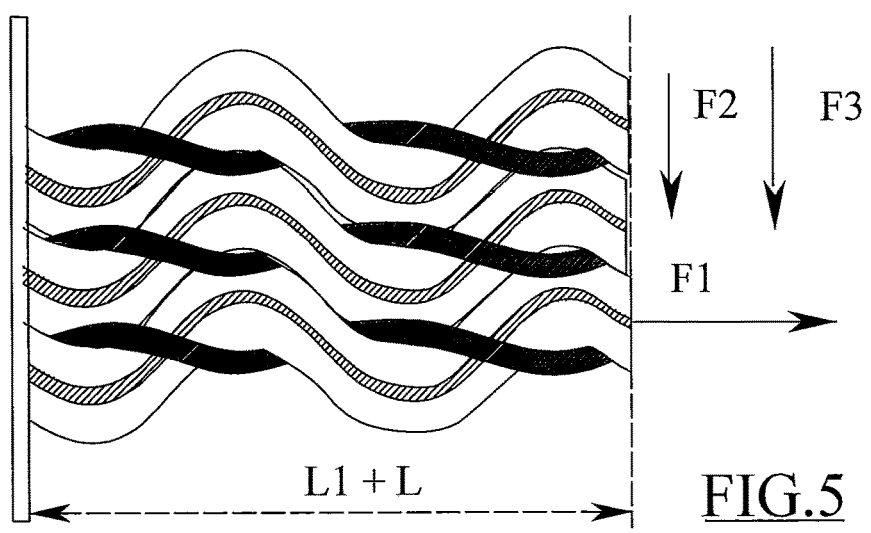
FIG. 5 shows a portion of a fabric comprising a plurality of composite yarn structures according to an embodiment of the invention.

An exemplary structure such as the one above described is represented in FIG. 5.

Such piezo-auxetic synergistic effect in the fabric is created by two components as follows. The first effect is the fact that the yarn structure 10 exhibits piezoelectric features thanks to the transverse pressure through the piezoelectric material created upon stretching, for example by applying the force F.

The second effect is that this pressure is exponentially higher within a fabric compared to a single yarn of the same structure, thanks to the fact that all the piezoelectric yarns forming the fabric gets wider, a phenomenon that produces additional pressure through all of the piezoelectric components, leading to an additional potential development between respective conductors.

In any case, the composite yarn structure 10 can create an enhanced potential difference between two conductors by piezoelectricity and exhibits a negative Poisson's ratio, upon stretching, whereby the Poisson ratio is defined as the percentage of expansion divided by the percentage of compression in transversal direction of a material.

Within a woven fabric structure or a rope structure, the composite yarn of the invention, 10, by using its auxetic features, produces an enhanced electric potential difference due to additional forces that originate from the fact that individual fibers experience an increased transverse pressure compared to yarns that are piezoelectric but not auxetic within the same woven structure. These additional forces have different directions, therefore, different piezoelectric constants are in use, such as d33, namely the volume change when a piezoelectric material is subject to an electric field, rather than d31. As is known piezoelectric constants, also known as piezoelectricity coefficients, quantifies the volume change when a piezoelectric material is subject to an electric field, or its polarization on application of a stress.

In the various embodiments of the invention, a portion of tensile stimuli are translated to transverse stimuli within a fabric construction due to auxeticity. This means the physical stimuli change direction, which in turn means that a different piezoelectric coefficient set is used to generate electric output.

A visual schematic comparison between a yarn structure that exhibits only piezoelectricity (FIG. 3) with a yarn structure that exhibits piezoelectricity and auxetic properties (FIG. 4) is hereby given.

In FIG. 3 there is no auxeticity, the piezoelectric constant used is d1 only which is an energy harvesting constant given by the formula $d1=V1/F1$, where V1 is the electric potential generated and F1 is the longitudinal force (FIG. 3).

Figure 4:
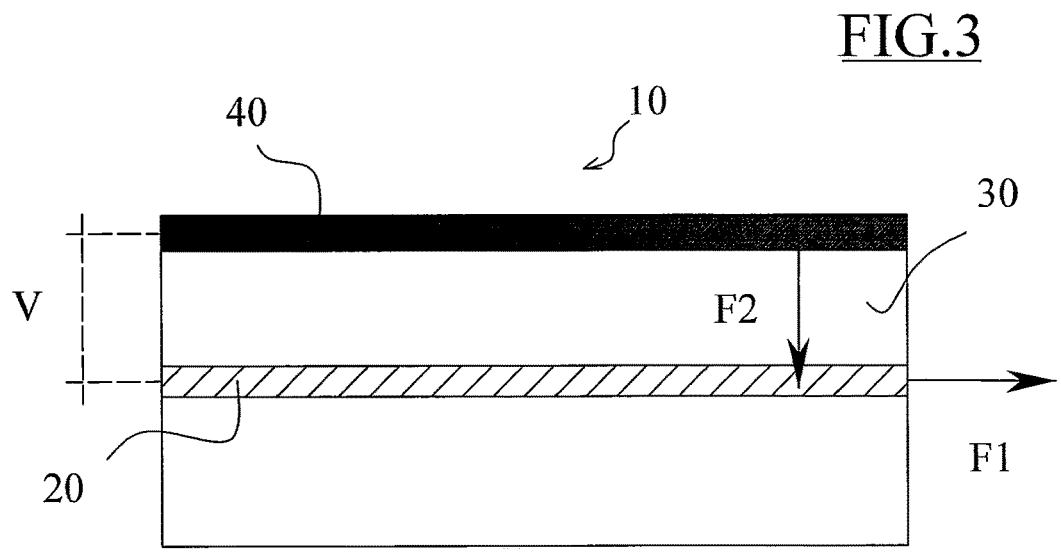
FIG. 4 is a sectional view of a yarn structure that exhibits piezoelectricity and auxetic properties.

When first element 15, i.e. the bicomponent element, is also subjected to a pressure towards its center, then another piezoelectric constant comes into play as an addition, namely d2 given by the formula $d2=V1/F1+V2/F2$, where V1 and V2 are electric potentials generated, F1 is the longitudinal force and F2 is a force perpendicular to F1 (FIG. 4).

In case of fabric or rope structures (such as the one represented in FIG. 5) that are made with a plurality of yarn structures, according to the various embodiments of the invention, an additional force F3 may be defined.

Force F3 defines, in addition to forces F1 and F2, another additional gain factor when the yarn is embodied within a fabric or in a rope.

Since each yarn gets larger due to its auxetic behavior, the force F2 in FIG. 4 increases more than in the case of a stand-alone yarn.

In such a case, the total force acting upon the piezoelectric component 30 increases to a value of F2+F3.

The value F3 represents the value of the force originating from the fact that neighboring yarns in the fabric or rope structure, which might also be auxetic, exert additional forces against each other resisting their widening due to the auxetic effect.

This phenomenon may increase the overall pressure on the piezoelectric material of component 30. Within a certain range, this phenomenon helps to obtain more overall efficiency of the final yarn as a strain sensor.

A further parameter to take into consideration may be the twisting angle of second element 40, which defines the number of turns per unit length of the whole yarn. The twisting angle is defined e.g. by the softness of the central bicomponent and may be calibrated accordingly: if the number of turns is more than necessary, then the auxetic behavior will not be present as the central bicomponent will have enough mechanic resistance against being bent.

As a general rule, and with reference to FIG. 1, the number of turns must be sufficient to cover the length L1 of the yarn structure 10 in a non-elongated configuration and to allow to reach the length L1+L when the yarn structure is in an elongated configuration. If the number of turns is less than necessary, then the d2 coefficient will not have a significant additional term, therefore, the additional gain will not be as high as it otherwise could. Considering the thickness of the piezoelectric layer, its thickness is usually within the range from a few hundreds of nano-meters to a few hundreds of micro-meters radially, namely 100 nm to 800 µm as measured radially having as centre the center of bicomponent first element.

In an embodiment of the invention, additional second elements may be used, provided that the additional second elements strictly follow the path of conductive second element 40 in order not to destroy the yarn geometry required to create the auxeticity phenomenon.

In other words, all the optional twisting second elements should be in-phase or synchronized with one another. In order to create such alternative filament structure, conductive second element 40 and all the possible additional second elements should be twisted first to create a twisting filament bundle; the twisting filament bundle is then twisted around the central bicomponent element 15. The optional additional second elements may be conductive or isolating.

Simulations have been carried out on the various embodiments of the invention.

Figure 6:
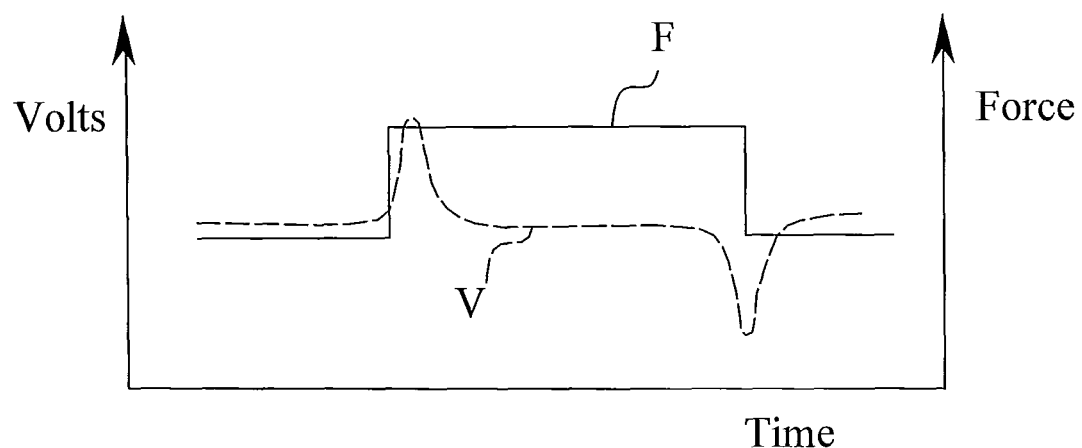
FIG. 6 shows a curve representing an electric potential across an arbitrary-value termination resistor, across electrodes, as a function of a force applied to the yarn structure in the configuration of FIG. 1A.
Figure 7:
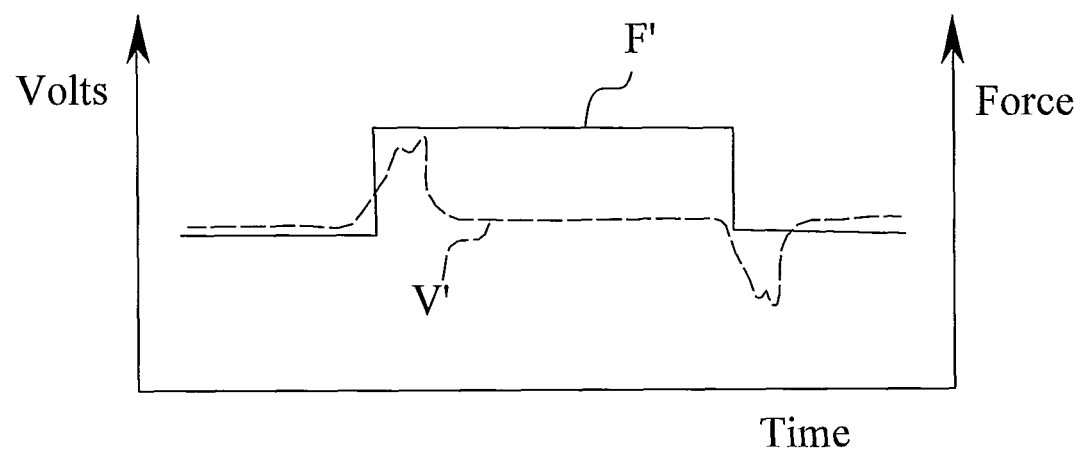
FIG. 7 shows a curve representing an electric potential across an arbitrary-value termination resistor, across electrodes, as a function of a force applied to the yarn structure in the configuration of FIG. 1B.
Figure 8:
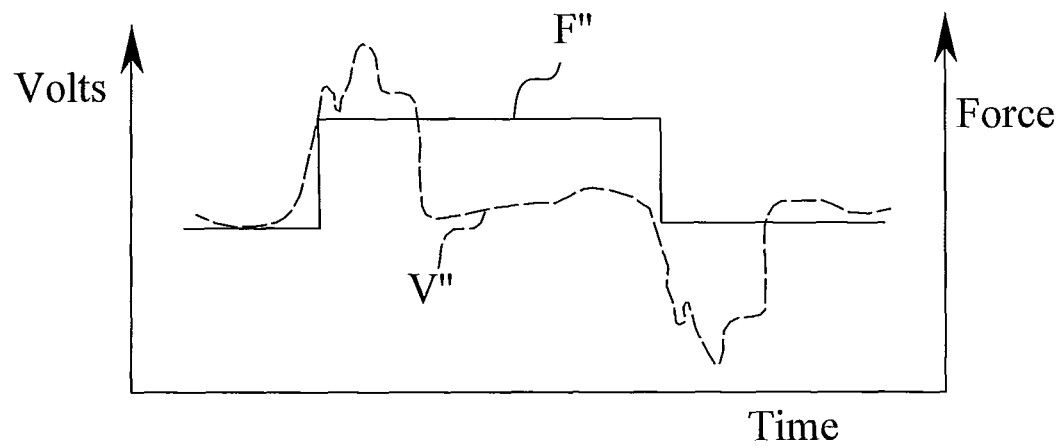
FIG. 8 shows a curve representing an electric potential across an arbitrary-value termination resistor, across electrodes, as a function of forces applied to the fabric of FIG. 5.

The result of such simulations will be hereby explained with particular reference to FIGS. 6-8.

FIG. 6 shows a curve V representing electric potential as a function of a force F applied to the yarn structure in the configuration of FIG. 1A; in the case of FIG. 6, a relatively small force F is applied to the yarn structure 10, leaving it substantially in the configuration represented on FIG. 1A. No significant auxetic deformation is therefore present.

In FIG. 6, curve F represents (not in scale) the force applied to the yarn structure 10 and curve V the electric potential due to the piezoelectric effect which follows a smooth Landau kind of potential distribution over time. It is noted also that the shape of the potential curve is not distorted.

In contrast, FIG. 7 shows a curve V' representing electric potential as a function of a stronger force (curve F') applied to the yarn structure in the configuration of FIG. 1B. In this case, due to the auxeticity phenomenon an additional electric potential development (curve V') is generated and is added to the one represented in FIG. 6.

Also, in FIG. 7 the time development of the electric potential is different from the case with no auxetic phenomenon, as well as the potential intensity different, both phenomena leading to a distortion in the shape of the electric potential development. It should also be noted that the areas under curves V and V' represent the total energy output generated, which is higher in the case of FIG. 7.

Finally, FIG. 8 shows a curve V" representing an electric potential as a function of forces (curve F") applied when the yarn structure is embedded into the fabric of FIG. 5.

In this case, a plurality of yarn structures are incorporated within a fabric construction or a rope or similar textile structure where each yarn structure experiences the effect of neighboring auxetic yarns and the pressure created by such neighboring yarns. This phenomenon further distorts the electric potential shape (curve V") because a third component of the force, namely F3, is experienced by the yarn structures. A weighted combination of the piezoelectric coefficients are in use.

The area under curve V" is further increased, leading to an increased energy output for a given fixed force F", which in turn means more efficiency.

In the composite yarn structure 10, the conductive component 20 of the first yarn 10 may be made of an elastic conductive material. As an example, the elastic conductive material of the conductive component 20 of the first element 10 may be a polymer including conductive metallic impurities. For example, such conductive metallic impurities may be made of silver or copper.

In the alternative, the elastic conductive material of the conductive component 20 of the first element 15 may be an intrinsically conductive polymer. For example, such intrinsically conductive polymers may be polyaniline (PANI) or polypyrrole (PPy). The thermoplastic component of the composite yarn structure 10 may be made of polyvinylidene fluoride (PVDF) or of any other suitable thermoplastic polymer.

In order to create a piezoelectric phase in the thermoplastic polymer, the drawn coaxial components are polarized under a strong electric field after heating to align the thermoplastic polymer chain. An optimum drawing ratio can be chosen to perform the drawing, in the absence of an electric field, of the coaxial components in order to impose the piezoelectric phase in the thermoplastic polymer.

Possible applications of the yarn structure of the invention are, among others,
i) wearable sensor technology for body position monitoring in fabric form and
ii) tensile monitoring of ropes used in a variety of areas from mountain climbing to heavy marine applications.

In some embodiments of the invention, the thermoplastic component 30 may have auxetic properties per se, in addition to the auxetic effect given to the whole yarn structure 10 by the second element 40.

While at least one exemplary embodiment has been presented in the foregoing summary and detailed description, it should be appreciated that a vast number of variations exist. It should also be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents.

The invention claimed is:

1. A composite yarn structure comprising a first element comprising a coaxial flexible bi-component monofilament including a conductive component and a thermoplastic component, the thermoplastic component exhibiting piezoelectric properties; and at least a second conductive element twisted around at least part of the first element to provide a composite yarn wherein said composite yarn exhibits auxetic properties and wherein said second conductive element has a lower elasticity with respect to the elasticity of the first element such that, upon elongation of the composite yarn structure in a first direction starting from an unstretched condition, the composite yarn structure expands in a second direction, in such a way that in an unstretched condition said first element extends in a rectilinear direction and said second element is twisted around said first element and in such a way that, upon elongation of said composite yarn structure, said second element is aligned with the elongation direction and said first element expands by forming a series of curves around the second element, whereby the dimensions of the composite yarn structure is increased both in first and second directions to generate an additional force on said thermoplastic component exhibiting piezoelectric properties of the first element.

2. The composite yarn structure according to claim 1, wherein said second conductive element is a conductive element or comprises a conductive element and the conductive component of the first element is made of an intrinsically conductive polymer.

3. The composite yarn structure of claim 2, wherein upon said elongation of the composite yarn structure in said first direction, the second conductive element shapes the first element in such a way as to provide an auxetic effect.

4. The composite yarn structure of claim 3, wherein said second conductive element shapes the first element in a helix around said second element.

5. The composite yarn structure according to claim 1, wherein the conductive component is made of an elastic conductive material.

6. The composite yarn structure according to claim 5, wherein the elastic conductive material is a polymer including conductive metallic impurities.

7. The composite yarn structure according to claim 5, wherein the elastic conductive material is a material chosen from blends of Low-density polyethylene (LDPE) or blends of High-Density Polyethylene (HDPE) with carbon nanotubes (CNTs), graphite, graphene nano-sheets, amorphous carbon, doped polyaniline, doped polypyrrole, and mixtures thereof.

8. The composite yarn structure according to claim 5, wherein the elastic conductive material is an intrinsically conductive polymer.

9. The composite yarn structure according to claim 1, wherein the thermoplastic component comprises a material chosen from polyvinylidene fluoride (PVDF) homopolymer and its copolymers with trifluoroethylene P(VDF-co-TrFE) or tetrafluoroethylene P(VDF-co-TFE) or odd numbered polyamides (PA).

10. The composite yarn structure according to claim 1, wherein the second conductive element comprises a plurality of filaments, at least one of said plurality of filaments being a metallic filament.

11. The composite yarn structure according to claim 1, wherein said conductive component and said thermoplastic component of the first element are coextruded.

12. An article comprising at least one composite yarn structure according to claim 1.

13. The article according to claim 12, wherein said article comprises at least said composite yarn structure arranged adjacent a further said composite yarn structure to bias each other upon being elongated.

14. The article according to claim 12, wherein said article comprises one of a fabric, a garment, clothes and a rope.

15. The article according to claim 13, wherein said article comprises one of a fabric, a garment, clothes and a rope.

16. A composite yarn structure comprising a first element comprising a coaxial flexible bi-component monofilament including a conductive component and a thermoplastic component, the thermoplastic component exhibiting piezoelectric properties; and at least a second conductive element twisted around at least part of the first element to provide a composite yarn wherein said composite yarn exhibits auxetic properties and wherein said second conductive element has a lower elasticity with respect to the elasticity of the first element such that, upon elongation of the composite yarn structure in a first direction, the composite yarn structure expands in a second direction, whereby the dimensions of the yarn is increased both in first and second directions to generate an additional force on said thermoplastic component exhibiting piezoelectric properties of the first element and wherein the tensile strength of the first element is in the range of 15-78 MPa, the tensile strength of the second element is preferably in the range of 500-2,000 MPa, wherein in an unstretched condition said first element extends in a rectilinear direction and said second element is twisted around said first element.

* * * * *